(12) United States Patent
Lee

(10) Patent No.: US 8,020,284 B2
(45) Date of Patent: Sep. 20, 2011

(54) PRODUCTION LINE

(75) Inventor: Chia-En Lee, Taipei Hsien (TW)

(73) Assignee: FIH (Hong Kong) Limited, Kowloon (HK)

( * ) Notice: Subject to any disclaimer, the term of this patent is extended or adjusted under 35 U.S.C. 154(b) by 111 days.

(21) Appl. No.: 12/512,376

(22) Filed: Jul. 30, 2009

(65) Prior Publication Data

US 2010/0162559 A1 Jul. 1, 2010

(30) Foreign Application Priority Data

Dec. 27, 2008 (CN) .......................... 2008 1 0306607

(51) Int. Cl.
*B23P 21/00* (2006.01)

(52) U.S. Cl. .............. 29/783; 29/785; 29/792; 29/33 K; 198/346.1; 198/817; 700/230

(58) Field of Classification Search .................... 29/729, 29/783–787, 799, 33 P, 711; 198/346, 465.2, 198/835, 842, 586, 817; 901/7, 15, 41; 700/230; 414/404, 416.12, 719

See application file for complete search history.

(56) References Cited

U.S. PATENT DOCUMENTS

| | | | |
|---|---|---|---|
| 4,069,764 A * | 1/1978 | Teyssedre | 104/172.5 |
| 4,301,958 A * | 11/1981 | Hatakenaka et al. | 228/4.5 |
| 4,588,880 A * | 5/1986 | Hesser | 235/376 |
| 4,783,904 A * | 11/1988 | Kimura | 29/786 |
| 6,421,893 B1 * | 7/2002 | Katayama et al. | 29/33 K |
| 6,654,663 B1 * | 11/2003 | Jokela | 700/230 |
| 6,705,001 B2 * | 3/2004 | How et al. | 29/783 |
| 7,105,377 B1 * | 9/2006 | Chang et al. | 438/110 |

* cited by examiner

*Primary Examiner* — Minh Trinh
(74) *Attorney, Agent, or Firm* — Altis Law Group, Inc.

(57) ABSTRACT

A production line used to assemble and test some electronic elements includes a first assembly line used to assemble some electronic elements requiring a relatively high requirements of cleanliness factor, a second assembly line used to assemble some electronic elements requiring a relatively low requirements of cleanliness factor, a first testing line used to do some testing items with a relatively high requirements of lightness, a second testing line used to do some testing items with a relatively low requirements of lightness, and a third testing line do some testing items requiring a relatively high requirements of cleanliness factor, the first assembly line, the second assembly line, the first testing line, the second testing line, and the third testing line are located adjacent to each other and connected together in series.

19 Claims, 6 Drawing Sheets

PRODUCTION LINE

CROSS-REFERENCE TO RELATED APPLICATION

This application is related to co-pending U.S. patent application Ser. No. U.S. Ser. No. 12/512,380, entitled "PRODUCTION LINE", by CHIA-EN LEE, which is the same assignee as the present application. The above-identified application is incorporated herein by reference.

BACKGROUND

1. Technical Field

The present disclosure relates to production lines and, particularly, to a production line used to produce portable electronic devices.

2. Description of Related Art

A production line for portable electronic devices typically includes assembling of components in a predetermined order and testing the assembled components after assembly. The production line includes at least an assembly line and a testing line connected to the assembly line.

However, such production line may be invariable and not satisfy high efficiency and quality productions.

Therefore, there is room for improvement within the art.

BRIEF DESCRIPTION OF THE DRAWINGS

Many aspects of the production line can be better understood with reference to the following drawings. These drawings are not necessarily drawn to scale, the emphasis instead being placed upon clearly illustrating the principles of the present production line. Moreover, in the drawings like reference numerals designate corresponding sections throughout the several views.

DETAILED DESCRIPTION

The present production line is suitable for producing electronic devices, e.g., mobile phones and personal digital assistants (PDAs).

Figure 1:
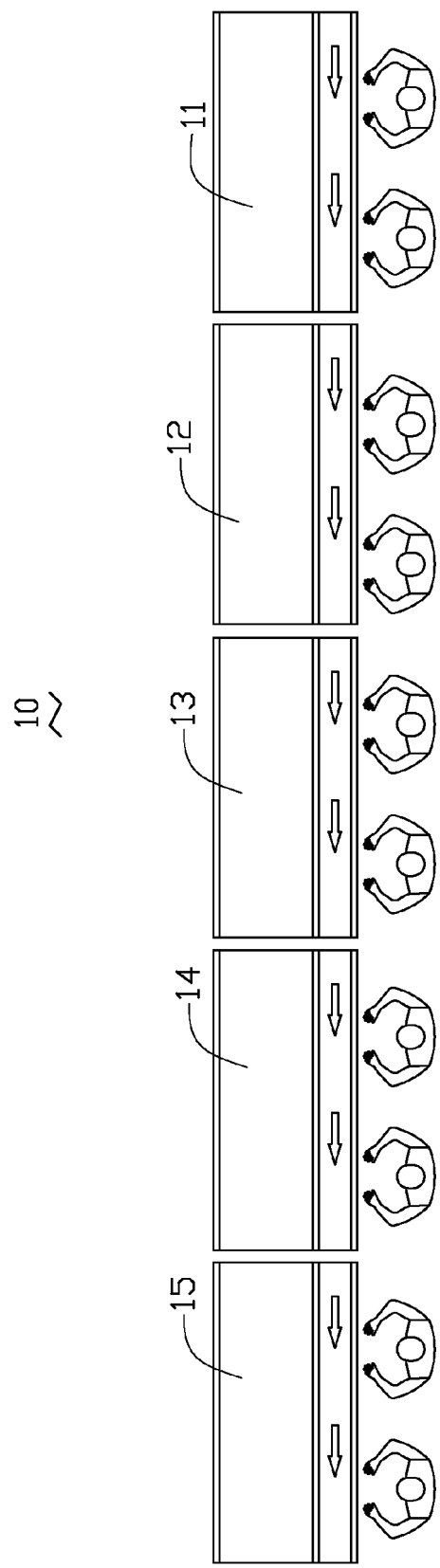
FIG. 1 is a schematic view of a production line, in accordance with an exemplary embodiment.

FIG. 1 shows an exemplary production line 10, the production line 10 includes a first assembly line 11, a second assembly line 12, a first testing line 13, a second testing line 14, and a third testing line 15. The first assembly line 11, the second assembly line 12, the first testing line 13, the second testing line 14, and the third testing line 15 are located adjacent to each other.

Figure 2:
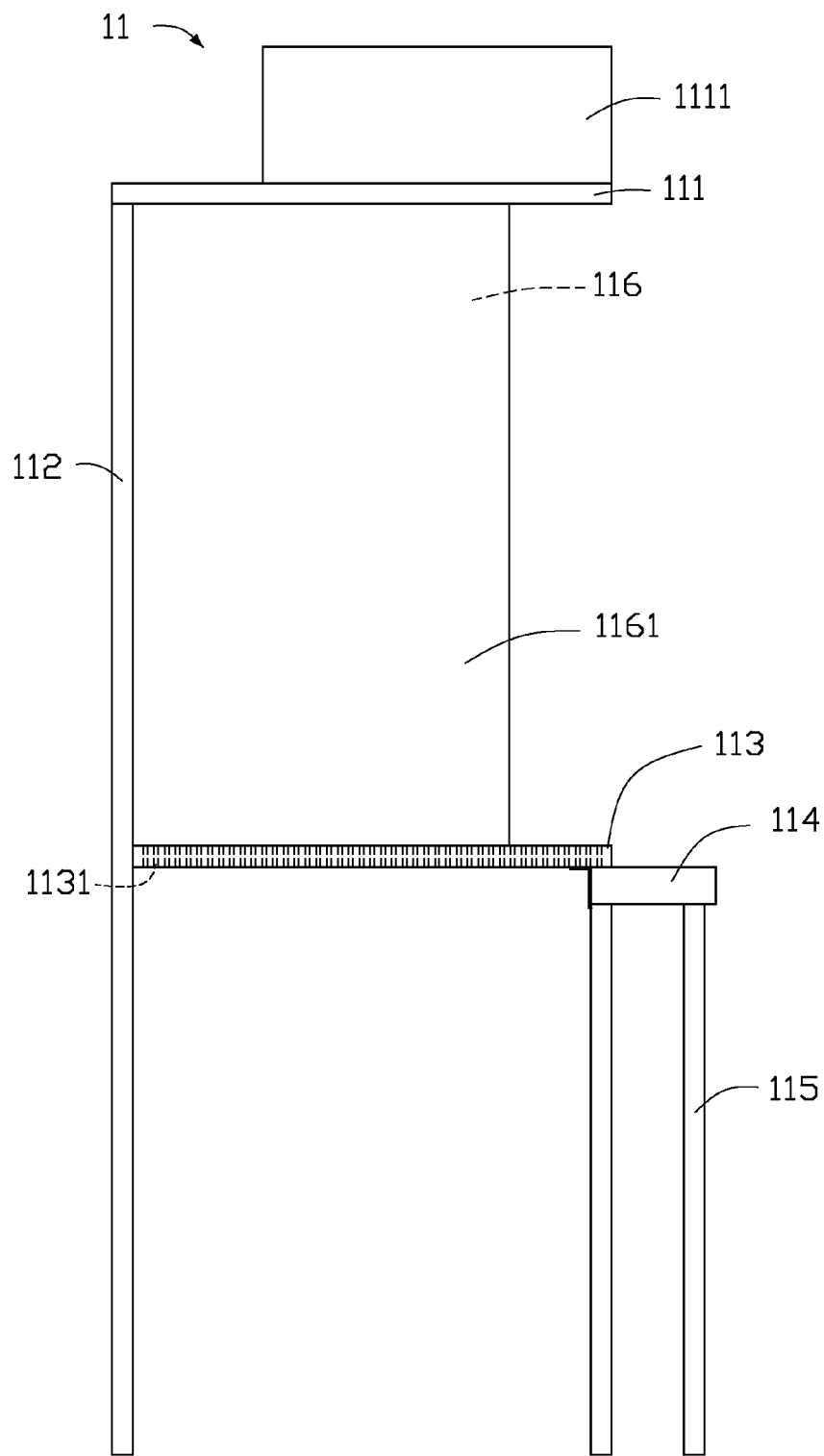
FIG. 2 is a side view of a first assembly line shown in FIG. 1.

Referring to FIG. 2, the first assembly line 11 includes a first top board 111, a first side board 112, a first working platform 113, a first conveyor belt 114, and a plurality of first support legs 115. The first top board 111 and the first working platform 113 are respectively mounted to the first side board 112. The first working platform 113 is located between the first conveyor belt 114 and the first side board 112. The first working platform 113 is used to hold assembly materials (not shown). The first top board 111, the first side board 112 and the first working platform 113 surround an assembly operating space 116. The assembly operating space 116 can be further enclosed by an anti-static film 1161, providing a high cleanliness environment for product assembly. Thus, operators can assemble electronic components requiring relatively high requirements of cleanliness factor, e.g., a liquid crystal display (LCD). The first top board 111 includes an air filter cleaner 1111 formed thereon, used to filter out/remove containments such as dust, pollen, mold, etc. from the assembly operating space 116. The first working platform 113 defines a plurality of through holes 1131, through which dust and etc. can vent out of the assembly operating space 116. The first support legs 115 are fastened to and located beneath the first working platform 113 and the conveyor belt 114, used to support the first assembly line 11.

Figure 3:
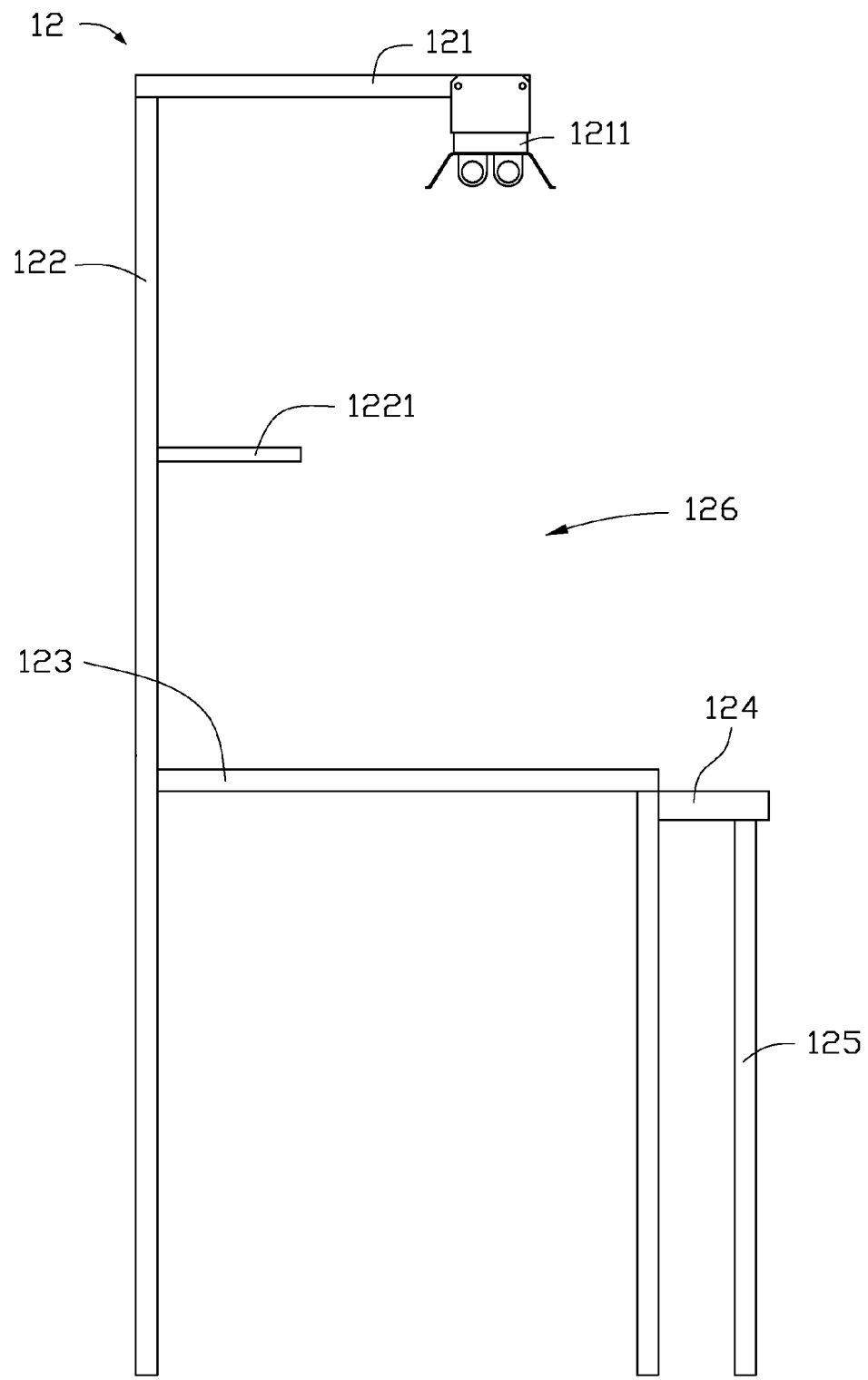
FIG. 3 is a side view of a second assembly line shown in FIG. 1.

Referring to FIG. 3, the second assembly line 12 includes a second top board 121, a second side board 122, a second working platform 123, a second conveyor belt 124, and a plurality of second support legs 125. The second top board 121 and the second working platform 123 are respectively mounted to the second side board 122. The second working platform 123 is located between the second conveyor belt 124 and the second side board 122. The second working platform 123 is used to hold assembly materials (not shown). The second support legs 125 are fastened to and located beneath the second working platform 123 and the second conveyor belt 124, used to support the second assembly line 12. The height of the second support legs 125 is less than the height of the first support legs 115. The second top board 121 includes a lamp 1211, used to light to the second assembly line 12. The second side board 122 includes a material platform 1221 protruding therefrom, also used to hold assembly materials. The second top board 121, the second side board 122 and the second working platform 123 surround a second assembly operating space 126. The second assembly operating space 126 is for operator to conduct assembly on electronic components.

Figure 4:
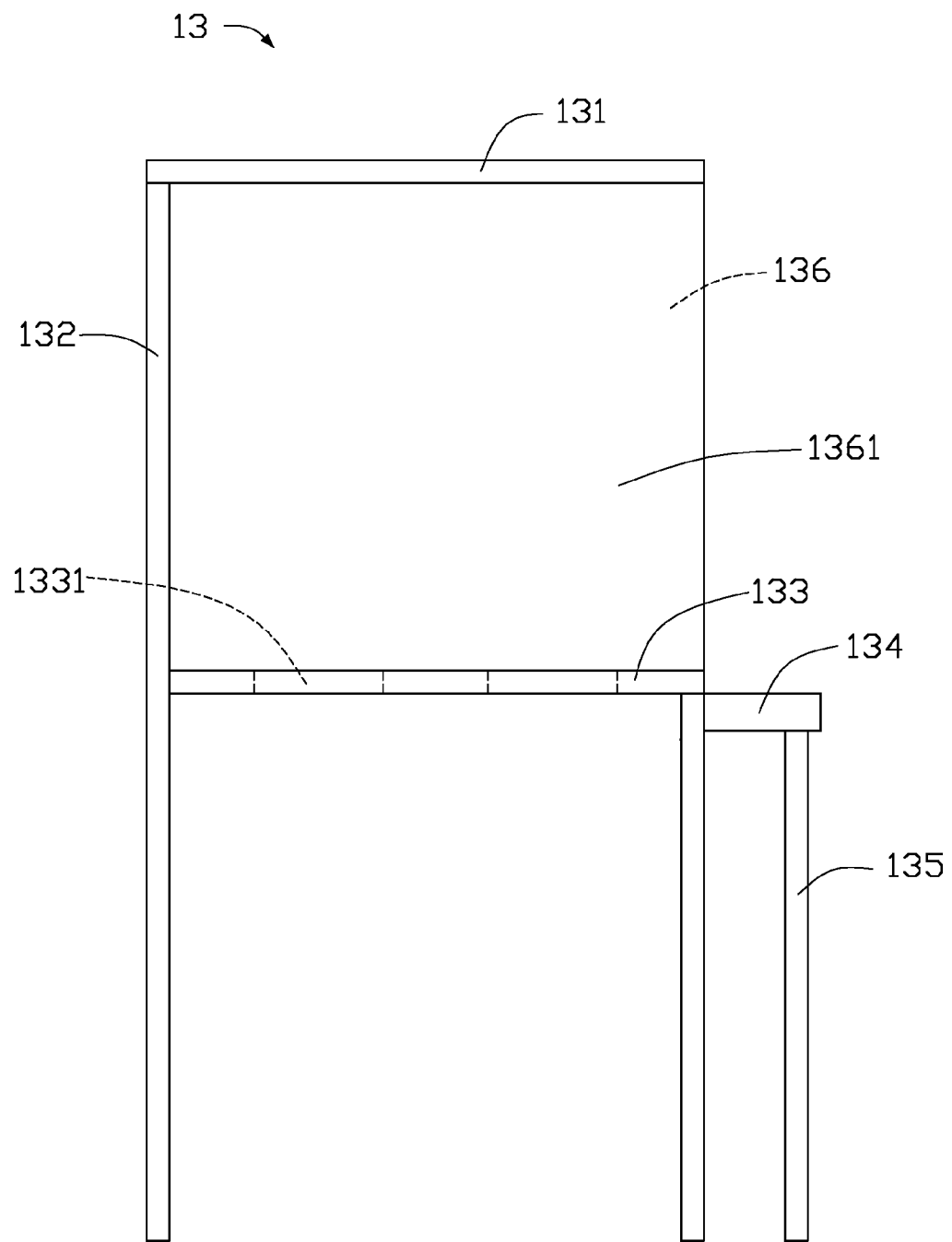
FIG. 4 is a side view of a first testing line shown in FIG. 1.

Referring to FIG. 4, the first testing line 13 includes a third top board 131, a third side board 132, a third working platform 133, a third conveyor belt 134, and a plurality of third support legs 135. The third top board 131 and the third working platform 133 are respectively mounted to the third side board 132. The third working platform 133 is located between the third conveyor belt 134 and the third side board 132. The third working platform 133 is used to hold electronic components (not shown). The third working platform 133 includes an anti-static film (not shown) to reduce electromagnetic interference on electronic elements. The third support legs 135 are fastened to and located beneath the third working platform 133 and the third conveyor belt 134, used to support the third assembly line 13. The height of the third support legs 135 is less than the height of the second support legs 125. The third top board 131, the third side board 132 and the third working platform 133 surround a first testing space 136. The first testing space 136 can be further enclosed by a lightproof film 1361, thus providing a dark testing environment. The third platform 133 defines a plurality of openings 1331, through which testing devices under the third platform 133 can extend and expose in the first testing space 136. Thus, operators can conduct test on electronic components with high sensitivity to light in the first testing space 136, e.g., to judge whether an LCD has any visual defects.

Figure 5:
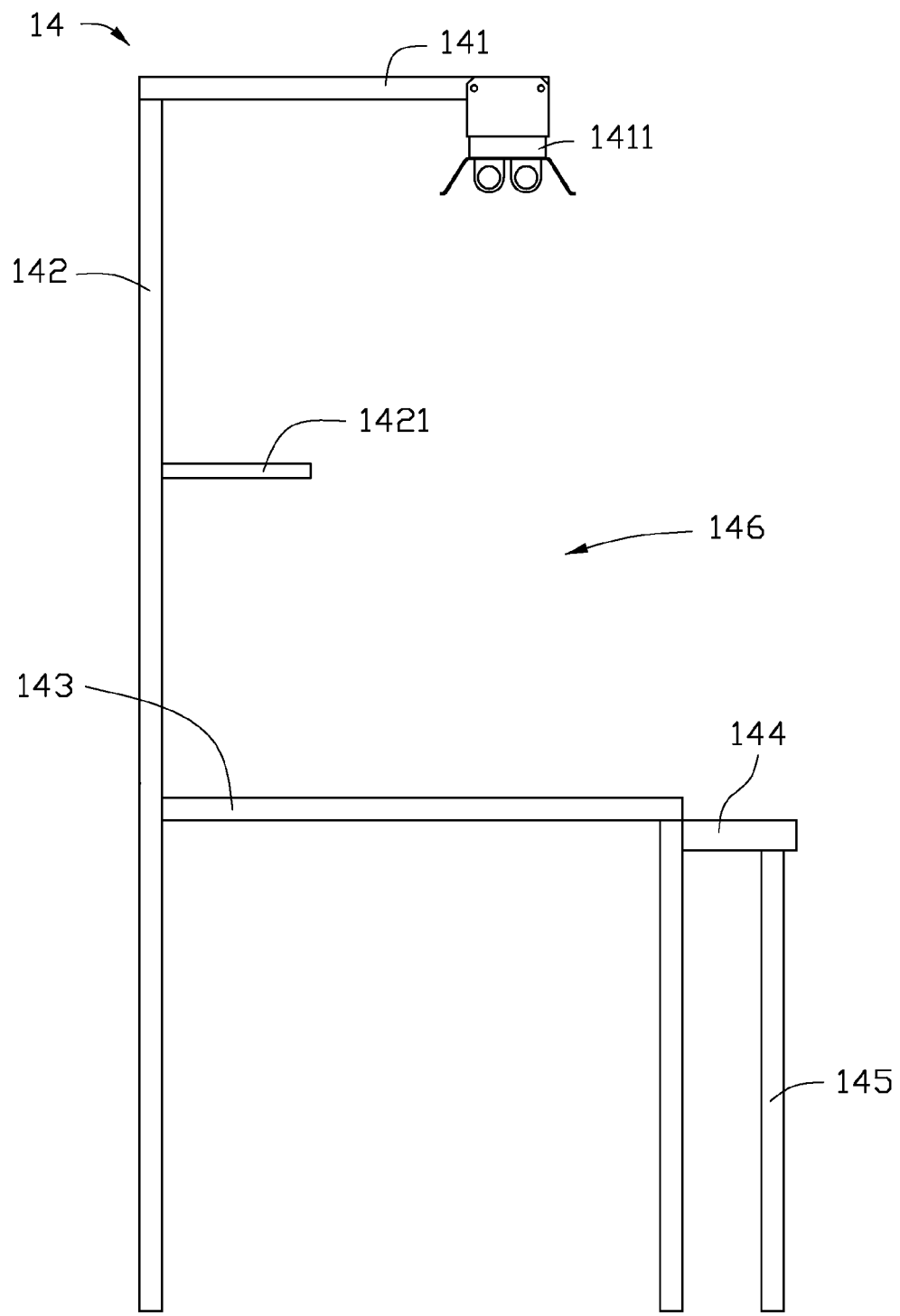
FIG. 5 is a side view of a second testing line shown in FIG. 1.

Referring to FIG. 5, the second testing line 14 includes a fourth top board 141, a fourth side board 142, a fourth working platform 143, a fourth conveyor belt 144, and a plurality of fourth support legs 145. The fourth top board 141 and the fourth working platform 143 are respectively mounted to the fourth side board 142. The fourth working platform 143 is located between the fourth conveyor belt 144 and the fourth side board 142. The fourth working platform 143 is used to hold electronic components. The fourth support legs 145 are fastened to and located beneath the fourth working platform 143 and the fourth conveyor belt 144, used to support the second testing line 14. The height of the fourth support legs 145 is less than the height of the third support legs 135. The fourth top board 141 includes a lamp 1411, used to provide light to the second testing line 14. The fourth board 142 includes a material platform 1421 protruding therefrom towards the fourth conveyor belt 144, used to hold electronic components. The fourth top board 141, the fourth side board 142 and the fourth working platform 143 surround a second testing space 146. Thus, an operator can conduct test on electronic components with a relatively low requirements of brightness in the second testing space 146, e.g., to test microphones.

Figure 6:
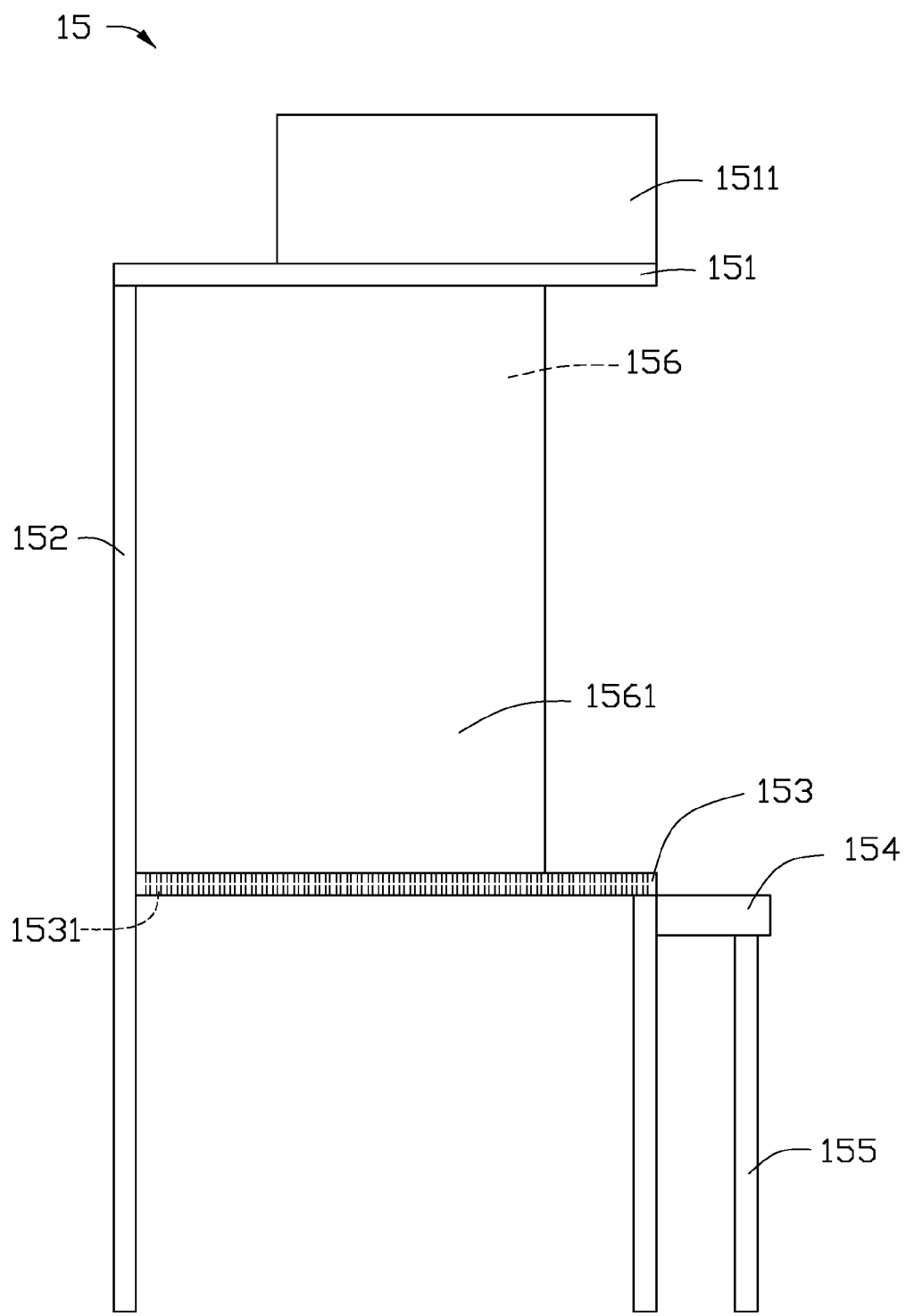
FIG. 6 is a side view of a third testing line shown in FIG. 1.

Referring to FIG. 6, the third testing line 15 includes a fifth top board 151, a fifth side board 152, a fifth working platform 153, a fifth conveyor belt 154, and a plurality of fifth support legs 155. The fifth top board 151 and the fifth working platform 153 are respectively mounted to the fifth side board 152. The fifth working platform 153 is located between the fifth conveyor belt 154 and the fifth side board 152. The fifth working platform 113 is used to hold assembly materials (not shown). The fifth working platform 153 includes an antistatic film (not shown) to reduce electromagnetic interference on electronic elements. The fifth support legs 155 are fastened to and located beneath the fifth working platform 153 and the fifth conveyor belt 154, used to support the fifth assembly line 15. The height of the fifth support legs 155 is less than the height of the fourth support legs 145. The fifth top board 151, the fifth side board 152 and the fifth working platform 153 surround a third testing space 156. The third testing space 156 can be further enclosed by an anti-static film 1561, providing high cleanliness environment for testing. Thus, operators can conduct test on electronic components with a relatively high requirements of cleanliness factor, e.g., to test appearance of an electronic device. The fifth top board 151 includes an air filter cleaner 1511 formed thereon, used to filter out/remove containments such as dust, pollen, mold, and etc from the third testing space 156. The fifth working platform 153 defines a plurality of through holes 1531, through which dust and etc. can vent out of the third testing space 156.

In use, the first conveyor belt 114, the second conveyor belt 124, the third conveyor belt 134, the fourth conveyor belt 144, and the fifth conveyor belt 154 are moving to convey electronic components thereon. Operators sit adjacent to the first working platform 113, the second working platform 123, the third working platform 133, the fourth working platform 143, and the fifth working platform 153, facing the first side board 112, the second side board 122, the third side board 132, the fourth side board 142, and the fifth side board 152. The operators firstly assemble electronic elements to form an electronic device, then test the electronic device on the first testing line 13, the second testing line 14, and the third testing line 15.

The production line 10 has the first assembly line 11, the second assembly line 12, the first testing line 13, the second testing line 14, and the third testing line 15 with different configurations according to different functions and requirements, improving production efficiency and quality.

It is to be understood, however, that even through numerous characteristics and advantages of the present disclosure have been set forth in the foregoing description, together with details of the structure and function of the disclosure, the disclosure is illustrative only, and changes may be made in detail, especially in matters of shape, size, and arrangement of sections within the principles of the disclosure to the full extent indicated by the broad general meaning of the terms, in which the appended claims are expressed.

What is claimed is:

1. A production line used to assemble and test some electronic elements comprising:
    a first assembly line used to assemble some electronic elements requiring a relatively high requirements of cleanliness;
    a second assembly line used to assemble electronic elements requiring a relatively low requirements of cleanliness;
    a first testing line used to test said some electronic elements with relatively high requirements of lightness;
    a second testing line used to test said some electronic elements with a relatively low requirements of lightness; and
    a third testing line used to test said some electronic elements requiring a relatively high requirements of cleanliness, the first assembly line, the second assembly line, the first testing line, the second testing line, and the third testing line being located adjacent to each other and connected together in series.

2. The production line as claimed in claim 1, wherein the first assembly line includes a first top board, a first side board, a first working platform, a first conveyor belt, the first top board and the first working platform are respectively mounted to two the first side board, the first working platform is located between the first conveyor belt and the first side board, the first top board, the first side board and the first working platform surround an assembly operating space, the assembly operating space is further enclosed by an anti-static film, thus providing a high cleanliness environment.

3. The production line as claimed in claim 2, wherein the first top board includes an air filter formed thereon, used to clean the assembly operating space.

4. The production line as claimed in claim 2, wherein the first working platform defines a plurality of through holes, through which dust vents out of the assembly operating space.

5. The production line as claimed in claim 1, wherein the second assembly line includes a second top board, a second side board, a second working platform, a second conveyor belt, the second top board and the second working platform are respectively mounted to both the second side board, the second working platform is located between the second conveyor belt and the second side board, the second top board, the second side board and the second working platform surround a second assembly operating space.

6. The production line as claimed in claim 5, wherein the first assembly line includes further includes first support legs, the first support legs are fastened to a periphery of the first working platform, used to support the first assembly line, the second assembly line includes further includes second support legs, the second support legs are fastened to a periphery of the second working platform, used to support the second assembly line, the height of the second support legs are less than the height of the first support legs.

7. The production line as claimed in claim 5, wherein the second top board includes a lamp, used to provide a bright assembly environment.

8. The production line as claimed in claim 5, wherein the second side board includes a material platform protruding therefrom, used to place some assembly materials.

9. The production line as claimed in claim 1, wherein the first testing line includes a third top board, a third side board, a third working platform, a third conveyor belt, the third top board and the third working platform are respectively mounted to both the third side board, the third working platform is located between the third conveyor belt and the third side board, the third top board, the third side board and the third working platform surround a first testing space, the first testing space is further enclosed by an lightproof film, thus providing a dark testing environment.

10. The production line as claimed in claim 9, wherein the second assembly line includes further includes second support legs, the second support legs are fastened to a periphery of the second working platform, used to support the second assembly line, the height of the second support legs are less than the height of the first support legs, the first testing line includes third support legs, the third support legs are fastened to a periphery of the third working platform, used to support the third assembly line, the height of the third support legs are less than the height of the second support legs.

11. The production line as claimed in claim 9, wherein the third platform defines a plurality of cavities, through which testing devices under the third platform expose out of the first testing space.

12. The production line as claimed in claim 9, wherein the third testing line includes a fifth top board, a fifth side board, a fifth working platform, a fifth conveyor belt, the fifth top board and the fifth working platform are respectively mounted to both the fifth side board, the fifth working platform is located between the fifth conveyor belt and the fifth side board, the fifth top board, the fifth side board and the fifth working platform surround a third testing space, the third testing space is further enclosed by an anti-static film, thus providing a high cleanliness environment.

13. The production line as claimed in claim 12, wherein the fifth top board includes an air filter formed thereon, used to clean the third testing space.

14. The production line as claimed in claim 12, wherein the fifth working platform defines a plurality of through holes, through which dust vents out of the third testing space.

15. The production line as claimed in claim 12, wherein the second testing line includes a plurality of fourth support legs, the fourth support legs are fastened to a periphery of the fourth working platform, used to support the second testing line, the third testing line further includes a fifth support legs, the fifth support legs are fastened to a periphery of the fifth working platform, used to support the fifth assembly line, the height of the fifth support legs are less than the height of the fourth support legs.

16. The production line as claimed in claim 1, wherein the second testing line includes a fourth top board, a fourth side board, a fourth working platform, a fourth conveyor belt, the fourth top board and the fourth working platform are respectively mounted to both the fourth side board, the fourth working platform is located between the fourth conveyor belt and the fourth side board, the fourth top board, the fourth side board and the fourth working platform surround a second testing space.

17. The production line as claimed in claim 16, wherein the first testing line includes third support legs, the third support legs are fastened to a periphery of the third working platform, used to support the third assembly line, the second testing line includes a plurality of fourth support legs, the fourth support legs are fastened to a periphery of the fourth working platform, used to support the second testing line, the height of the fourth support legs are less than the height of the third support legs.

18. The production line as claimed in claim 17, wherein the fourth top board includes a lamp, used to provide a bright testing environment.

19. The production line as claimed in claim 17, wherein the fourth side board includes a material platform protruding therefrom towards the fourth conveyor belt, used to place some assembly materials.

\* \* \* \* \*